United States Patent
Chu et al.

(10) Patent No.: US 8,384,088 B2
(45) Date of Patent: Feb. 26, 2013

(54) VERTICAL LIGHT EMITTING DIODE HAVING AN OUTWARDLY DISPOSED ELECTRODE

(75) Inventors: Chen-Fu Chu, Hsinchu (TW); Wen-Huang Liu, Hsinchu (TW); Hao-Chun Cheng, Hsinchu (TW)

(73) Assignee: Semileds Optoelectronics Co., Ltd. (TW)

( * ) Notice: Subject to any disclaimer, the term of this patent is extended or adjusted under 35 U.S.C. 154(b) by 99 days.

(21) Appl. No.: 12/939,984

(22) Filed: Nov. 4, 2010

(65) Prior Publication Data

US 2011/0108851 A1    May 12, 2011

(30) Foreign Application Priority Data

Nov. 6, 2009  (TW) .............................. 98137665 A

(51) Int. Cl.
*H01L 33/32*    (2010.01)

(52) U.S. Cl. .................... 257/76; 257/99; 257/E33.066
(58) Field of Classification Search .................... 257/76, 257/99, E33.066
See application file for complete search history.

(56) References Cited

U.S. PATENT DOCUMENTS

| | | | |
|---|---|---|---|
| 2008/0073659 A1* | 3/2008 | Tamura et al. | 257/97 |
| 2010/0096660 A1* | 4/2010 | Jeong | 257/99 |
| 2010/0102345 A1* | 4/2010 | Kong et al. | 257/98 |

* cited by examiner

*Primary Examiner* — Marc Armand
(74) *Attorney, Agent, or Firm* — Martine Penilla Group, LLP

(57) ABSTRACT

The invention relates to a vertical light emitting diode (VLED) having an outwardly disposed electrode, the vertical light emitting diode comprises a conductive base, a semiconductor epitaxial structure formed on the conductive base, a passivation layer formed at the periphery of the semiconductor epitaxial structure, and a conductive frame formed on the passivation layer and contacting with the edge of the upper surface of the semiconductor epitaxial structure such that the conductive frame is electrically connected to the semiconductor epitaxial structure.

14 Claims, 9 Drawing Sheets

VERTICAL LIGHT EMITTING DIODE HAVING AN OUTWARDLY DISPOSED ELECTRODE

CROSS-REFERENCE TO RELATED APPLICATION

This application claims the priority benefit of Taiwan application serial no. 98137665, filed on Nov. 6, 2009. All disclosure of the Taiwan application is incorporated herein by reference.

BACKGROUND OF THE INVENTION

The present invention relates to a vertical light emitting diode (VLED); more specifically, the present invention relates to a VLED having an outwardly disposed electrode.

In conventional LED structures, contact electrodes are disposed within light emitting areas and thus occupy a portion of light emitting areas, leading to reduction of light extraction efficiency. Besides, after encapsulation, an LED package has a dome with a semicircular or elliptic cross-section, so light is emitted therefrom in all directions. Further, phosphors are usually incorporated into the LED package such that the light emitted from the LED chip is converted into white light or light of a different wavelength. Usually, the phosphors tend to be distributed non-uniformly, so the LED emits light having non-uniform color temperature and light pattern with yellow halo phenomenon at the periphery.

In order to solve such problems, U.S. Pat. No. 6,674,096 B2 discloses a method for producing uniform light emission by a design regarding the outer surface of an LED package; U.S. Pat. No. 7,111,964 B2 discloses a method for improving light emission uniformity, in which an LED chip are directly coated with phosphors. However, the aforementioned documents solve neither the problem regarding non-uniform phosphor distribution nor the problem that contact electrodes occupy a portion of light emitting areas.

SUMMARY OF THE INVENTION

In view of the aforementioned problems, one embodiment of the present invention provides a VLED having outwardly disposed electrodes, comprising: a conductive base; a semiconductor epitaxial structure, formed on the conductive base; a passivation layer, formed at the periphery of the semiconductor epitaxial structure; and a conductive frame, formed on the passivation layer and contacting with the edge of the upper surface of the semiconductor epitaxial structure such that the conductive frame is electrically connected to the semiconductor epitaxial structure.

Another embodiment of the present invention provides a VLED having outwardly disposed electrodes, comprising: a conductive base; a semiconductor epitaxial structure, formed on the conductive base; a passivation layer, formed at the periphery of the semiconductor epitaxial structure; an electrode frame, formed at the edge of the upper surface of the semiconductor epitaxial structure and electrically connected to the semiconductor epitaxial structure; a non-conductive frame, formed on the passivation layer and a portion of the electrode frame; and a bond pad, formed on the non-conductive frame and electrically connected to the electrode frame.

Yet another embodiment of the present invention provides an LED having a frame, comprising: a conductive base; a semiconductor epitaxial structure, formed on the conductive base; a contact electrode, disposed on the semiconductor epitaxial structure; a passivation layer, formed at the periphery of the semiconductor epitaxial structure; and a frame, formed on the passivation layer.

Other aspects and advantages of the present invention will become more apparent from the following detailed description, taken in conjunction with the accompanying drawings, illustrating by way of example the present invention.

BRIEF DESCRIPTION OF THE DRAWINGS

In the accompanying drawings of the present application, the same reference numerals are used for the similar elements.

DETAILED DESCRIPTION OF THE PREFERRED EMBODIMENTS

Figure 1A:
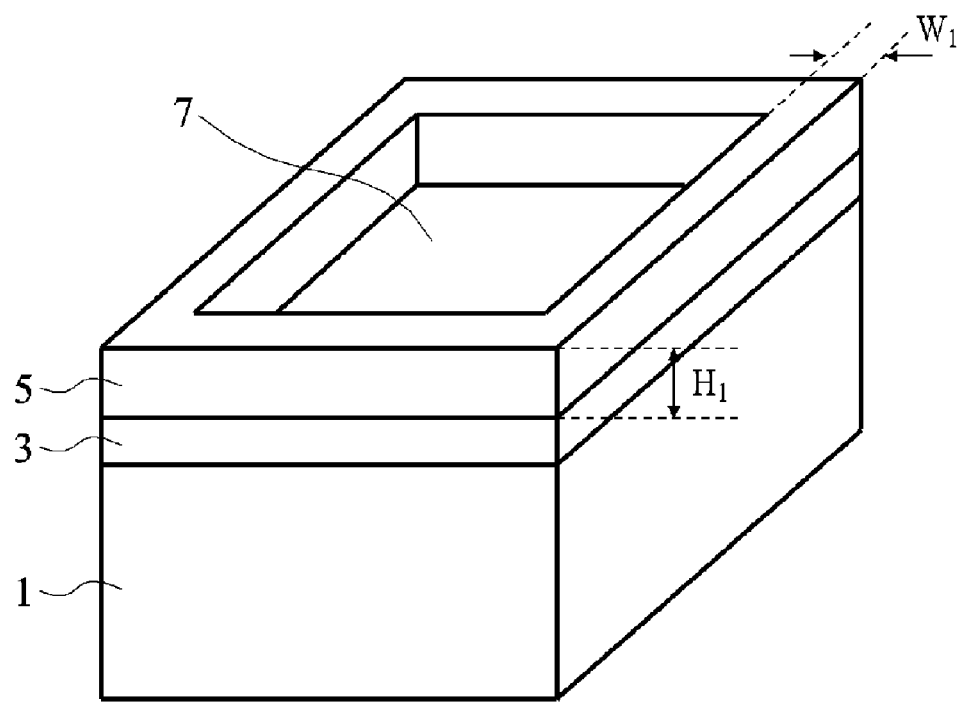
FIG. 1A is a perspective view showing a VLED having a conductive frame according to an embodiment of the present invention.
Figure 1B:
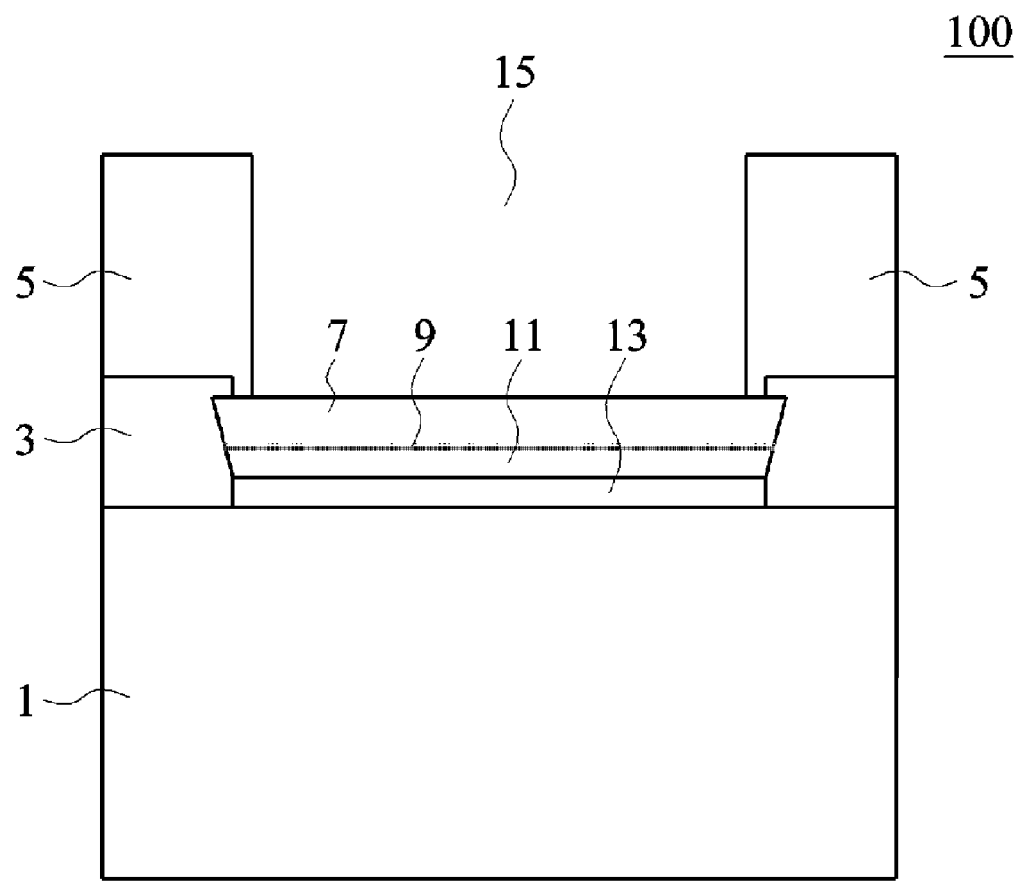
FIG. 1B is a cross-section view showing the VLED in FIG. 1A

FIG. 1A is a perspective view showing a VLED (vertical light emitting diode) 100 having a conductive frame according to an embodiment of the present invention; FIG. 1B is a cross-section view showing the VLED 100 in FIG. 1A. As showed in the FIGS. 1A and 1B, the VLED 100 comprises: a conductive base 1, a passivation layer 3, a conductive frame 5, an n-GaN layer 7, an active layer 9, a p-GaN layer 11, and a mirror layer 13. A semiconductor epitaxial structure is composed of the n-GaN layer 7, the active layer 9 and the p-GaN layer 11. The conductive frame 5 is formed on the passivation layer 3 and contacts with the edge of the upper surface of the semiconductor epitaxial structure of the VLED 100, in which case an ohmic contact can be formed, such that current is turned on and flows through the n-GaN layer 7. That is to say, the conductive frame 5 can be used as the contact electrode of the VLED 100. Since the conductive frame 5 is provided with an opening 15, the n-GaN layer 7 is exposed from the conductive frame 5 through the opening 15. The conductive base 1 may be made of Cu, Ni, Ag, Au, Co, Al, Sn, W, Mo, Pd, Pt, Rh, or an alloy thereof. Besides, the conductive base 1 may be made of Si, SiC, Ge, GaAs, InP, GaN, or graphite.

For the purpose of P—N insulation, the passivation layer 3 is formed at the periphery of the semiconductor epitaxial structure. For example, the conductive frame 5 may be made of a metal or a metal alloy, such as Al, Ti, Cu, Ni, Au, Ag, Co, Fe, Sn, and an alloy thereof. In another embodiment of the present invention, the conductive frame 5 may be made of an anisotropic conductive film (ACF), a conductive adhesive (e.g. silver paste) or other conductive materials. The conductive frame 5 may be formed, for example, by use of one of electroplating, electroless plating, physical vapor deposition (PVD), chemical vapor deposition (CVD), evaporation, sputtering, spray coating, screen printing, inject printing, and a combination thereof. The conductive frame 5 has a width (W1) between about 1 μm and about 200 μm, and a height (H1) between about 1 μm and about 200 μm.

Since the conductive frame 5 is formed at the edge of the light emitting area (i.e. the semiconductor epitaxial structure) of the VLED 100 in place of the conventional contact electrode disposed within the light emitting area, the effective area for light emission is enlarged, leading to increase of light extraction efficiency.

Figure 2A:
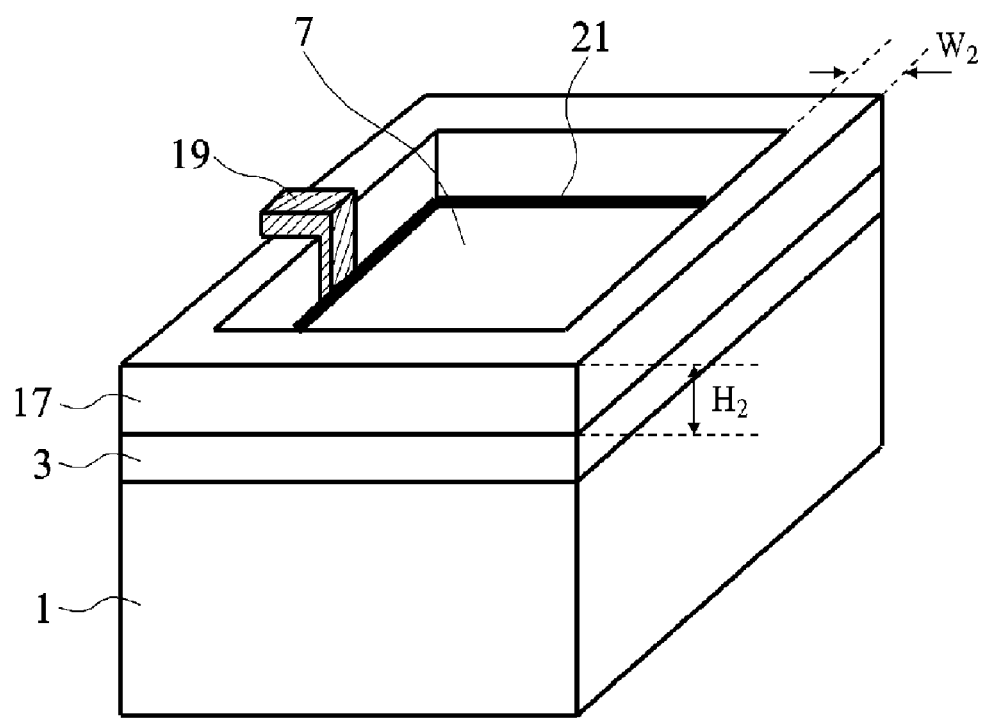
FIG. 2A is a perspective view showing a VLED according to another embodiment of the present invention.
Figure 2B:
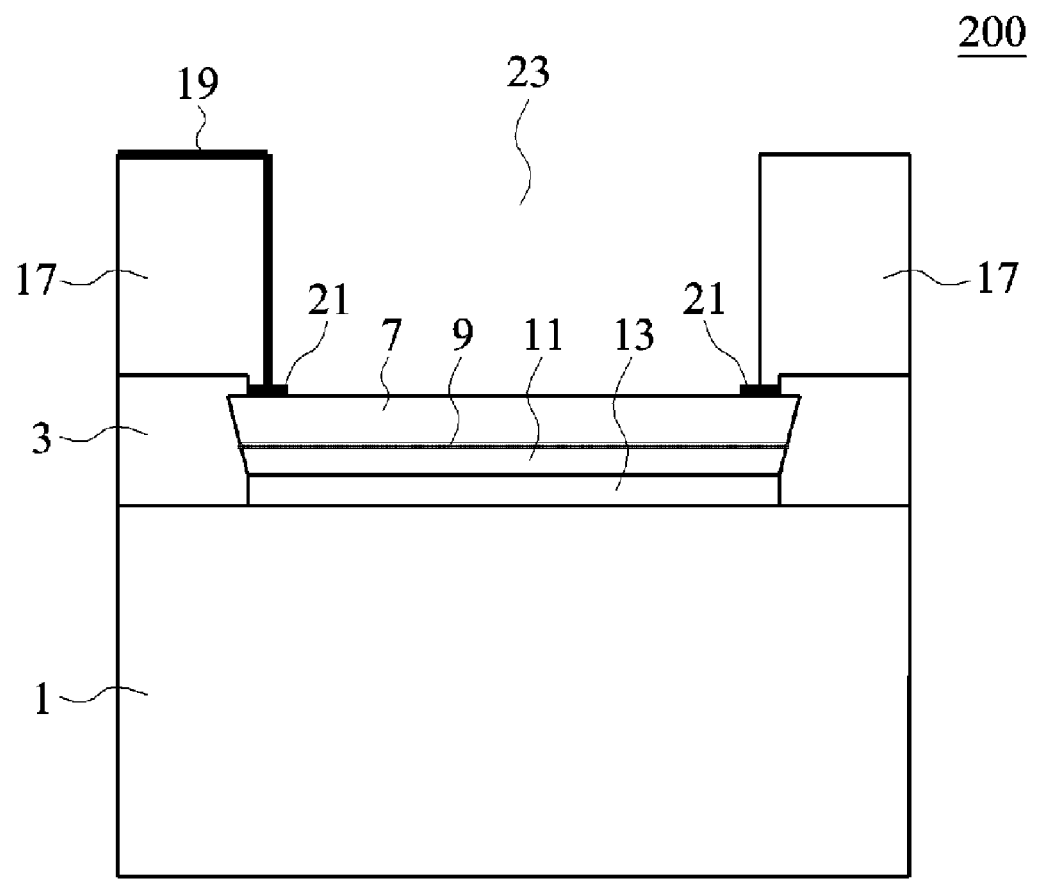
FIG. 2B is a cross-section view showing the VLED in FIG. 2A.

FIG. 2A is a perspective view showing a VLED 200 according to another embodiment of the present invention; FIG. 2B is a cross-section view showing the VLED 200 in FIG. 2A. As showed in FIGS. 2A and 2B, the VLED 200 comprises: a conductive base 1, a passivation layer 3, an n-GaN layer 7, an active layer 9, a p-GaN layer 11, a mirror layer 13, a non-conductive frame 17, a bond pad 19, and an electrode frame 21. A semiconductor epitaxial structure is composed of the n-GaN layer 7, the active layer 9 and the p-GaN layer 11. The electrode frame 21 is formed at the edge of the upper surface of the semiconductor epitaxial structure of the VLED 200 and electrically connected to the n-GaN layer 7. Then, the non-conductive frame 17 is formed on a portion of the electrode frame 21. Therefore, the non-conductive frame 17 is also disposed at the edge of the semiconductor epitaxial structure. The non-conductive frame 17 is also formed on the passivation layer 3; the bond pad 19 is formed on the non-conductive frame 17 and electrically connected to the electrode frame 21. By use of the disposition and connection of the bond pad 19 and the electrode frame 21, current is turned on and flows through the n-GaN layer 7. Since the non-conductive frame 17 is provided with an opening 23, the n-GaN layer 7 is exposed from the non-conductive frame 17 through the opening 23.

For example, the non-conductive frame 17 may be made of a photosensitive material, such as photoresist (e.g. dry film resist), a light-curing material (e.g. light-curing resin, such as light-curing epoxy). The non-conductive frame 17 may be made of a non-photosensitive material, such as an organic polymer (including polyimide, parylene, silicone, epoxy, etc.), other inorganic materials (including ceramic, glass, $SiO_2$, $Al_2O_3$, $Si_3N_4$, ZnO, $Ta_2O_5$, $TiO_2$, HfO, MgO, etc.). The bond pad 19 may be formed, for example, by use of one of electroplating, electroless plating, PVD, CVD, evaporation, sputtering, spray coating, screen printing, inject printing, and a combination thereof. The non-conductive frame 17 has a width (W2) between about 1 μm and about 200 μm, and a height (H2) between about 1 μm and about 200 μm. For example, the bond pad 19 may be made of a metal or a metal alloy, such as Al, Ti, Cu, Ni, Au, Ag, Co, Fe, Sn, Pd, Bi and an alloy thereof. Besides, the electrode frame 21 may be formed, for example, by use of one of electroplating, electroless plating, PVD, CVD, evaporation, sputtering, spray coating, screen printing, inject printing, and a combination thereof. In the embodiments of the present invention, the electrode frame 21 may be made of Al, Ni, Au, Ti, Pt, Cu, Cr, Pd, Bi or an alloy thereof, into which a material such as TaN, TiN, Si is doped in order to increase the conductivity thereof.

Since the non-conductive frame 17 and the electrode frame 21 are formed at the edge of the light emitting area (i.e. the semiconductor epitaxial structure) of the VLED 200 in place of the conventional contact electrode formed within the light emitting area, the effective area for light emission is enlarged, leading to increase of light extraction efficiency.

Figure 3:
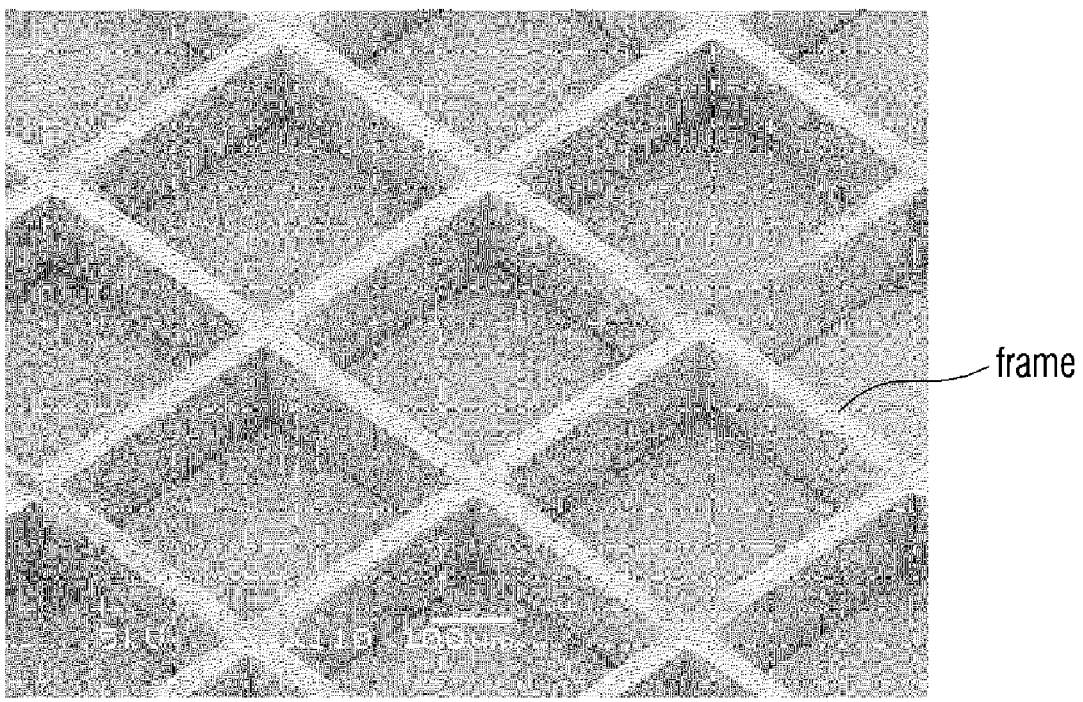
FIG. 3 is a real image, during wafer-level processing, showing a VLED having frames according to one embodiment of the present invention.

FIG. 3 is a real image, during wafer-level processing, showing a VLED having frames according to one embodiment of the present invention. After the wafer production has been completed, a separation procedure, such as wafer scribing, can be used to acquire VLED chips having frames.

Figure 4:
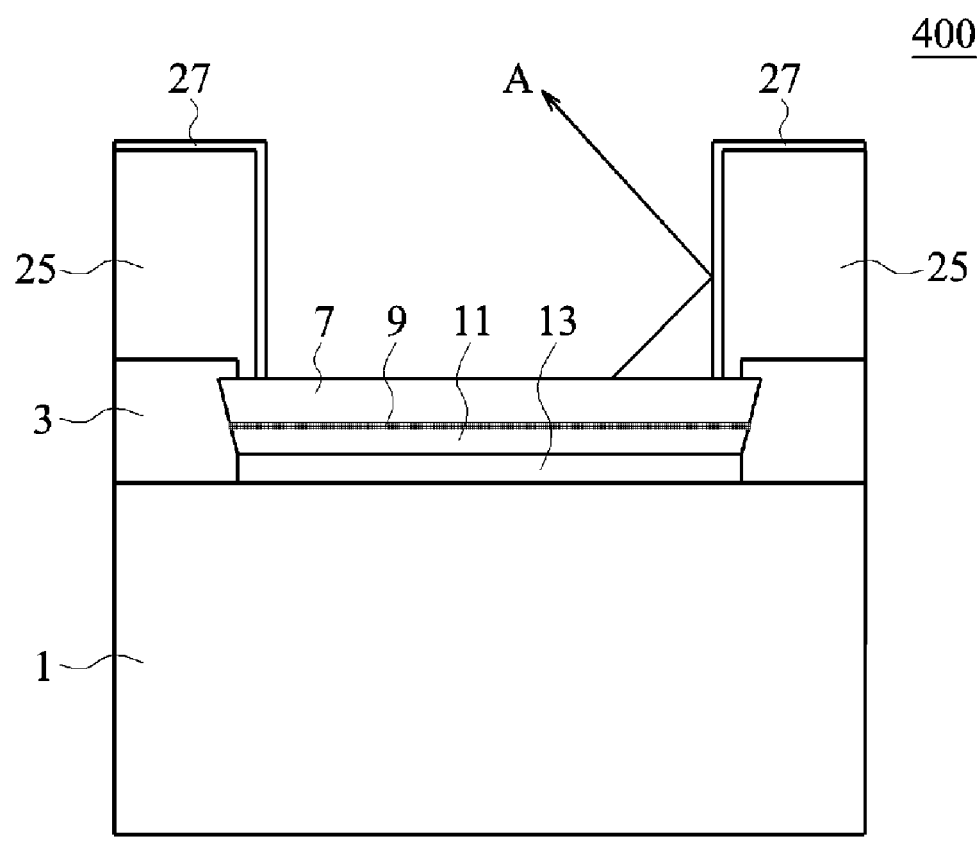
FIG. 4 is a cross-section view showing a VLED according to another embodiment of the present invention.

FIG. 4 is a cross-section view showing a VLED 400 according to another embodiment of the present invention. The VLED 400 has a structure similar to that of the VLED 100 showed in FIG. 1B. The difference therebetween is that the VLED 400 comprises a reflective layer 27, which is formed on the surface of a frame 25, to assist in reflecting the light emitted from the VLED 400 to the outside. More specifically, the light emitted onto the frame 25 can be reflected upward (as shown by the arrow A in FIG. 4) and away from the semiconductor epitaxial structure (composed of the n-GaN layer 7, the active layer 9 and the p-GaN layer 11) of the VLED 400 by the reflective layer 27, which prevents the light from being absorbed by the frame 25, leading to increase of light extraction efficiency. While not shown in FIGS. 2A and 2B, the reflective layer 27 disclosed in this embodiment can be applied to the VLED 200 disclosed therein. That is to say, the reflective layer 27 can be formed on the surface of the non-conductive frame 17 (FIGS. 2A and 2B). The reflective layer 17 may be made of Ag, Al, other high reflective metals, or other multi-layered dielectric film stacks. The reflective layer 17 may be formed by use of one of electroplating, electroless plating, PVD, CVD, evaporation, sputtering, spray coating, screen printing, inject printing, and a combination thereof.

Various embodiments will be described below regarding packaged VLEDs having frames according to the present invention.

Figure 5A:
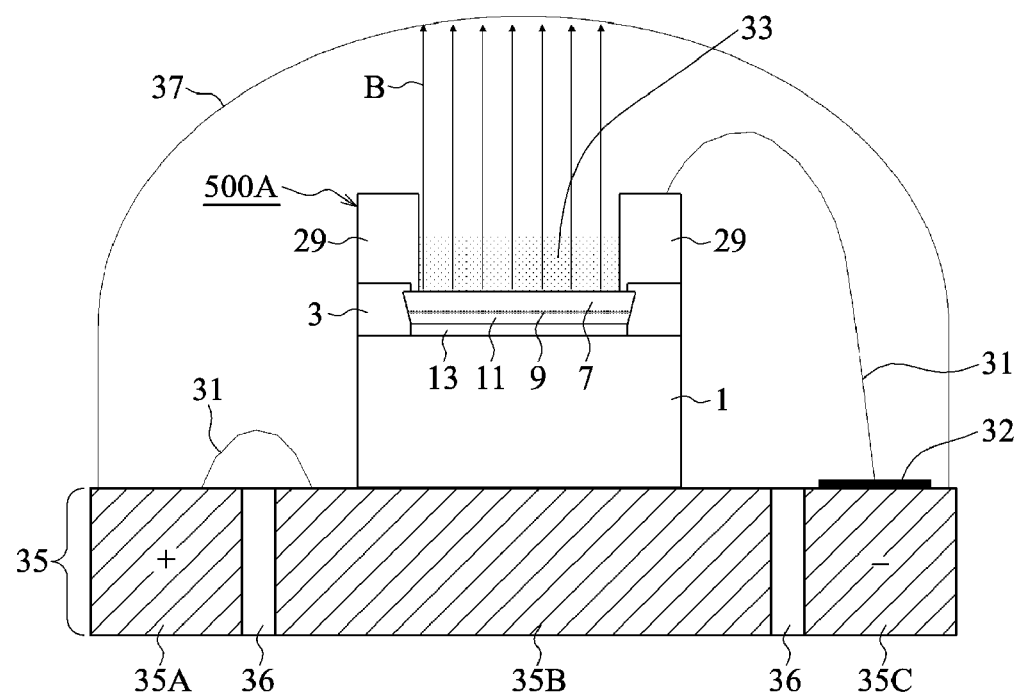
FIG. 5A is a cross-sectional view showing a packaged VLED according to one embodiment of the present invention.
Figure 5B:
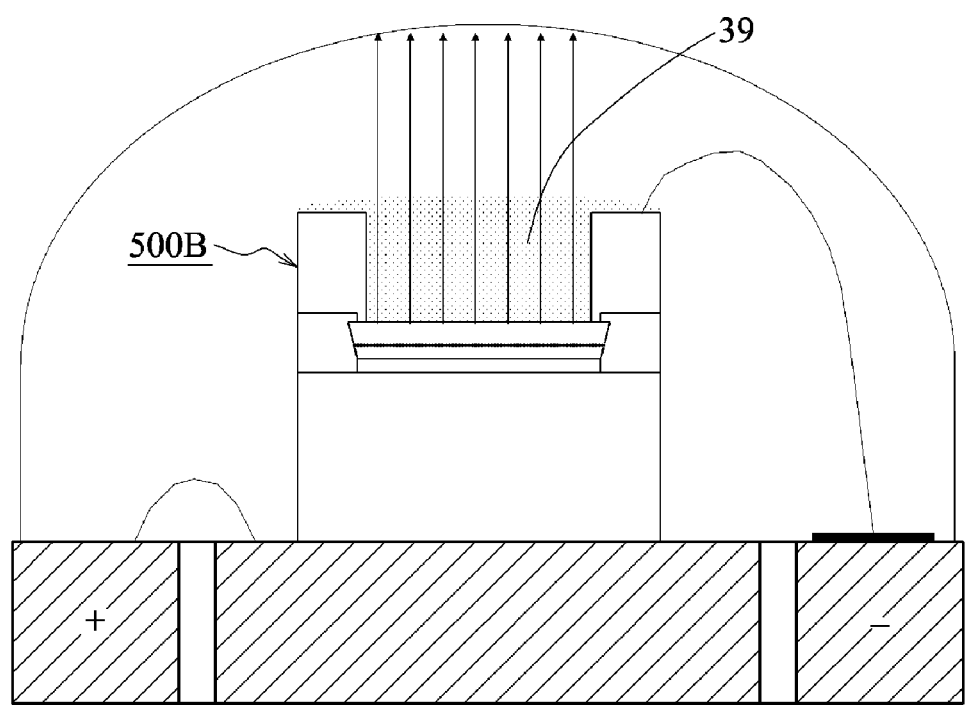
FIG. 5B is a cross-sectional view showing a packaged VLED according to another embodiment of the present invention.
Figure 5C:
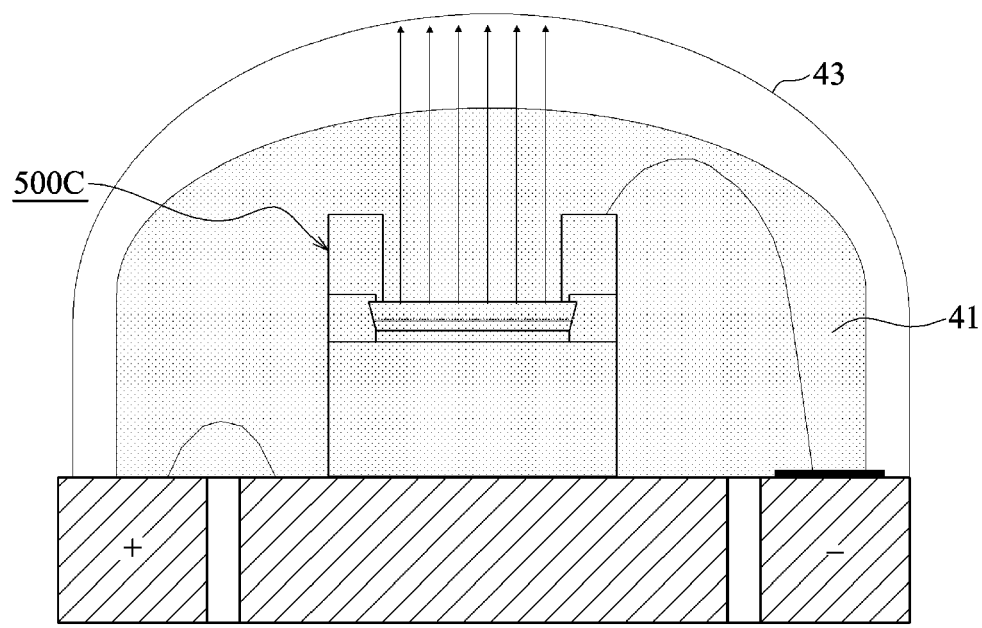
FIG. 5C is a cross-sectional view showing a packaged VLED according to yet another embodiment of the present invention.

FIG. 5A is a cross-sectional view showing a packaged VLED 500A according to one embodiment of the present invention; FIG. 5B is a cross-sectional view showing a packaged VLED 500B according to another embodiment of the present invention; FIG. 5C is a cross-sectional view showing a packaged VLED 500C according to yet another embodiment of the present invention. As showed in FIG. 5A, a lead frame 35 comprises a first conductive sector 35A, a base frame 35B, and a second conductive sector 35C, wherein a gap 36 exists between the base frame 35B and the conductive sectors 35A, 35C, respectively. As showed in FIG. 5A, the VLED 500A is mounted on the base frame 35B of the lead frame 35 and electrically connected to the conductive sector 35A, 35C of the lead frame 35 via wires 31 and a bond pad 32. While two wires 31 and one bond pad 32 are illustrated in the drawings, it is possible to vary the number of the wires as well as bond pads depending on different requirements. When using the conductive frame 5 shown in the FIGS. 1A and 1B, the conductive frame 5 of the VLED 100 is connected to the conductive sector of the lead frame via the wires 31; when using the non-conductive frame 17 shown in FIGS. 2A and 2B, the bond pad 19 of the VLED 200 is connected to the conductive sector of the lead frame via the wires 31.

In a conventional LED package structure, the LED package has a dome with a semicircular or elliptic cross-section, so the light is emitted therefrom in all directions. Besides, since the phosphors are difficult to be distributed uniformly, the LED package tends to emit light having non-uniform color temperature and light pattern with yellow halo phenomenon at the periphery.

According to an embodiment of the present invention, since a frame 29 is disposed in VLED 500A, phosphors 33 are confined within the frame 29 such that the phosphors 33 can be uniformly distributed within the frame 29. The phosphors 33 may be disposed by use of coating, spray coating, screen printing, inject printing, or dispensing. The VLED 500A can be packaged by use of an encapsulant 37 to encapsulate the VLED 500A, the wires 31 and the bond pad 32 therein, so as to prevent from device damage due to impact as well as phosphor decay due to oxidation. According to other embodiments of the present invention, the bond pad 32 is omitted since the bond pad 32 can be directly formed on the conductive sectors of the lead frame. In an embodiment of the present invention, the encapsulant is made of epoxy or silicone resin. The light is emitted from the VLED 500A in a vertical direction, as showed by the arrow B in FIG. 5A. Through the phosphors 33 that are distributed uniformly within the frame 29, the light emitted from the VLED 500A is converted and has uniform color temperature, leading to the reduced amount of the phosphors and cost reduction.

In FIGS. 5B and 5C, the same reference numerals as those in FIG. 5A are omitted for simplicity.

FIG. 5B shows two situations. First, the frame is filled with phosphors 39 having different particle sizes. Second, because of a different production method, the phosphors 39 overflow but remain on the frame due to surface tension. The phosphors 39 may be disposed by use of coating, spray coating, screen printing, inject printing, or dispensing.

As showed in FIG. 5C, phosphors 41 are not confined within the frame; more specifically, the VLED 500C is encapsulated by the phosphors 41. Then, the phosphors 41 are encapsulated by an encapsulant 43. The phosphors 41 may be disposed by use of coating, spray coating, screen printing, inject printing, or dispensing. The embodiments showed in FIGS. 5A-5C can be simultaneously applied to those showed in FIGS. 1A-1B, FIGS. 2A-2B and FIG. 4

Besides, the structure showed in FIG. 1A can be utilized, for simplicity, to interpret another embodiment of the present invention, in which the phosphors can be disposed at a specific location and the contact electrodes are not shifted outwardly, wherein the frame of the VLED is conductive or non-conductive, the contact electrode (not shown) thereof is formed within the light emitting area (i.e. the semiconductor epitaxial structure), and an ohmic contact is formed between the contact electrode and the n-GaN layer 7. Therefore, the phosphors can be confined within an expected region by means of the deposition of the conductive or non-conductive frame. The VLED described in the present embodiment can be applied to the embodiments showed in FIGS. 5A-5C, in which the contact electrode of the VLED is connected to the conductive sector of the lead frame via the wires. The frame described in the present embodiment has the same material, dimension and application as those of the embodiments described in FIG. 1A, FIG. 1B, FIG. 2A, FIG. 2B and FIG. 4, which are not described in detail herein.

The present invention provides a VLED structure having an outwardly disposed electrode. Since the contact electrode is disposed outwardly, the light emitting area of the VLED is increased, leading to increase of light extraction efficiency. More specifically, according to the embodiments of the present invention, the contact electrode of the VLED can be formed outside the light emitting area, so as to retrieve the area occupied by the conventional contact electrode and then increase light extraction efficiency of the VLED. Summing up the above, the present invention has the following advantages: (1) since the VLED having the frame can effectively confine the distribution of phosphors, the light has more uniform color temperature distribution at all angles, leading to effective cost reduction and yield improvement; and (2) since the bond pads are outwardly disposed and independently formed on the frame, they don't occupy the light emitting area of the VLED, leading to increase of light extraction efficiency and uniform light emission from the VLED.

While some embodiments of the present invention are described above, it is intended that the scope of the invention be limited not by this detailed description, but rather by the claims appended hereto. Besides, it is intended that the following appended claims be interpreted as including all such alterations, permutations, and equivalents as fall within the true spirit and scope of the present invention.

What is claimed is:

1. A VLED device having an outwardly disposed electrode, comprising:
   a lead frame, composed of a base frame and one or more conductive sector;
   a VLED, disposed on the base frame; and
   one or more wire, configured to connect the conductive frame of the VLED to the conductive sector of the lead frame,
   wherein the VLED comprises:
   a conductive base;
   a semiconductor epitaxial structure, disposed on the conductive base;
   a passivation layer, formed at the periphery of the semiconductor epitaxial structure; and
   a conductive frame, formed on the passivation layer and contacting with the edge of the upper surface of the semiconductor epitaxial structure such that the conductive frame is electrically connected to the semiconductor epitaxial structure.

2. The VLED device of claim 1, further comprising:
   a phosphor, disposed within the conductive frame of the VLED.

3. The VLED device of claim 1, further comprising:
   a phosphor, configured to encapsulate the VLED.

4. The VLED device of claim 2, further comprising:
   an encapsulant, configured to encapsulate the VLED and the phosphor.

5. The VLED device of claim 2, wherein the phosphor is disposed by use of coating, spray coating, screen printing, inject printing, or dispensing.

6. The VLED device of claim 3, further comprising:
   an encapsulant, configured to encapsulate the phosphor.

7. The VLED device of claim 3, wherein the phosphor is disposed by use of coating, spray coating, screen printing, inject printing, or dispensing.

8. A VLED device, comprising:
   a lead frame, composed of a base frame and one or more conductive sector;
   a VLED, disposed on the base frame; and
   one or more wire, configured to connect the contact electrode of the VLED to the conductive sector of the lead frame,
   wherein the VLED comprises:
   a conductive base;
   a semiconductor epitaxial structure, disposed on the conductive base;
   a contact electrode, formed on the semiconductor epitaxial structure;
   a passivation layer, formed at the periphery of the semiconductor epitaxial structure; and
   a frame, formed on the passivation layer.

9. The VLED device of claim 8, further comprising:
   a phosphor, disposed within the frame of the VLED.

10. The VLED device of claim 8, further comprising:
    a phosphor, configured to encapsulate the VLED.

11. The VLED device of claim 9, further comprising:
    an encapsulant, configured to encapsulate the VLED and the phosphor.

12. The VLED device of claim 9, wherein the phosphor is disposed by use of coating, spray coating, screen printing, inject printing, or dispensing.

13. The VLED device of claim 10, further comprising:
an encapsulant, configured to encapsulate the phosphor.

14. The VLED device of claim 10, wherein the phosphor is disposed by use of coating, spray coating, screen printing, inject printing, or dispensing.

* * * * *